United States Patent
Bonneville

(12)
(10) Patent No.: US 6,286,591 B1
(45) Date of Patent: Sep. 11, 2001

(54) THERMAL HARNESS USING THERMAL CONDUCTIVE FIBER AND POLYMER MATRIX MATERIAL

(75) Inventor: W. Scott Bonneville, Cupertino, CA (US)

(73) Assignee: Space Systems/Loral, Inc., Palo Alto, CA (US)

( * ) Notice: Subject to any disclaimer, the term of this patent is extended or adjusted under 35 U.S.C. 154(b) by 0 days.

(21) Appl. No.: 09/435,663

(22) Filed: Nov. 8, 1999

(51) Int. Cl.[7] .................................................. H05K 7/20
(52) U.S. Cl. ............................................. 165/185; 361/704
(58) Field of Search .................................. 165/185, 905; 361/704

(56) References Cited

U.S. PATENT DOCUMENTS

| | | | |
|---|---|---|---|
| 4,916,038 | * | 4/1990 | Lau et al. ............................. 428/447 |
| 5,077,637 | * | 12/1991 | Martorana ............................ 165/185 |
| 5,542,471 | * | 8/1996 | Dickinson ............................ 165/170 |
| 5,769,158 | * | 6/1998 | Yao ........................................ 165/185 |
| 5,858,537 | * | 1/1999 | Brown et al. ........................ 428/408 |
| 6,052,280 | * | 4/2000 | Dilley et al. ......................... 361/687 |

* cited by examiner

Primary Examiner—Allen Flanigan
(74) Attorney, Agent, or Firm—Kenneth W. Float

(57) ABSTRACT

A thermal harness comprising one or more tows of braided or bundled thermally conductive fiber extending from each of a plurality of heat generating devices to one or more heat dissipating devices. The harness may include an encapsulating membrane to contain the multiple tows. At each end or node of the tows, they are fanned out and splayed onto a patch of nonoutgassing polymer matrix material. A second piece of nonoutgassing polymer matrix material may be used to encapsulate the splayed tows at each node. The nonoutgassing polymer matrix material comprises high conductivity, small diameter fibers thermally coupled to the splayed tows of fiber and to the heat generating and heat dissipating devices. The node may be attached to the heat generating and dissipating devices using an adhesive or pyrolytic graphite flakes disposed between the polymer matrix material and the heat generating and dissipating devices. Alternatively, a plastic connector or a backing plate may secure the ends of the thermal harness to the heat generating and heat dissipating devices.

20 Claims, 1 Drawing Sheet

THERMAL HARNESS USING THERMAL CONDUCTIVE FIBER AND POLYMER MATRIX MATERIAL

BACKGROUND

The present invention relates generally to heat conducting apparatus, and more particularly, to a thermal harness employing carbon based fiber and polymer matrix material that may be used in spacecraft applications.

Conventional thermal straps or harnesses for use as thermal interfaces in spacecraft applications use aluminum rope encased at the ends in an aluminum block and secured by bonding. These thermal straps or harnesses are relatively heavy and are limited thermally by the adhesive bond. These thermal straps also provide only point-to-point solutions, and can add significant weight.

Conventional thermal interface materials use a highly loaded (organic) carrier with many conductive particles. With such conventional interface materials, the bond line thickness is minimized in order to maximize thermal performance. Unfortunately, a thermal bottleneck exists because of the poor conductance through the matrix and at (many) particle-to-particle contact points. The conventional gasket interface materials work relatively well for thin bond lines and flat surfaces. Additionally, the gasket interface materials require significant pressure to achieve higher conductance values.

Accordingly, it is an objective of the present invention to provide for an improved thermal harness that may be used in spacecraft applications that overcome the limitation of available heat conducting apparatus, and especially those used in spacecraft applications.

SUMMARY OF THE INVENTION

To accomplish the above and other objectives, the present invention comprises a thermal harness that provides the ability to branch to multiple components and requires no metallic end fittings. The thermal harness comprises one or more groups of tows of braided or bundled thermally conductive (carbon) fiber respectively extending from one or more heat generating devices to one or more heat dissipating devices. The harness may include an encapsulating membrane to contain the multiple tows. The heat generating devices are typically disposed on printed circuit boards, are part of feedhorns, or provide signal amplification, for example. In a spacecraft application, the heat dissipating device is typically a radiator panel of a spacecraft, or components that are pointed to radiate energy.

At each node or endpoint of the tows of thermally conductive fiber, the tows are fanned out and splayed onto a patch of polymer matrix material, such as silicone, urethane, or Gelvet™ material, for example. A second piece of polymer matrix material, such as silicone, urethane, or Gelvet material, for example, may be used to encompass or encapsulate the splayed tows of thermally conductive fiber at each node. The node may be attached to the heat generating and heat dissipating devices using fasteners, or a layer of adhesive disposed between the polymer matrix material and the respective the heat generating and heat dissipating devices. Alternatively, a plastic connector, or a backing plate may be secured to the heat generating and heat dissipating devices. Furthermore, pyrolytic graphic flakes may be used to thermally connect the carbon fibers of the harness with fibers of the polymer matrix (Gelvet) material.

The polymer matrix material comprises high thermal conductivity, small diameter fibers that are disposed normal to surfaces to which they are attached, and hence are normal to surfaces of the polymer matrix material. The high thermal conductivity fibers protrude from at least one surface of the polymer matrix material so that they contact the tows of thermally conductive fiber. The high conductivity fibers adjust to and penetrate surfaces to which they are attached and conform to macroscopic non-planarity of the surfaces.

The fibers of the polymer matrix material thermally contact the heat generating devices, the heat dissipating devices, and the tows of thermally conductive fiber, thus providing a thermal path between the multiple components. The fibers act as continuous conductors of heat from surfaces of the heat generating devices to the tows of thermally conductive fiber. A gel encapsulant may be used to keep the fibers in place and reduce possible contamination.

The thermal harness, because it is designed to pass outgassing requirements for space applications, may be used to interface to electrical boxes, amplifiers, and heat pipes, and the like, employed in spacecraft.

BRIEF DESCRIPTION OF THE DRAWINGS

The various features and advantages of the present invention may be more readily understood with reference to the following detailed description taken in conjunction with the accompanying drawing, wherein like reference numerals designate like structural elements, and in which.

DETAILED DESCRIPTION

Figure 1:
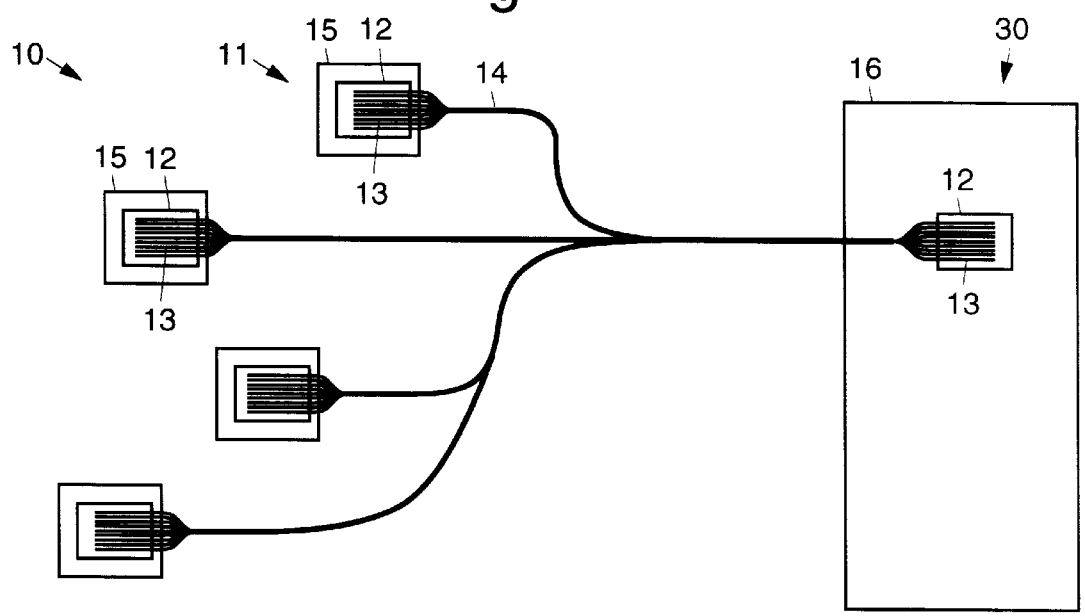
FIG. 1 illustrates an exemplary thermal harness in accordance with the principles of the present invention.
Figure 2:
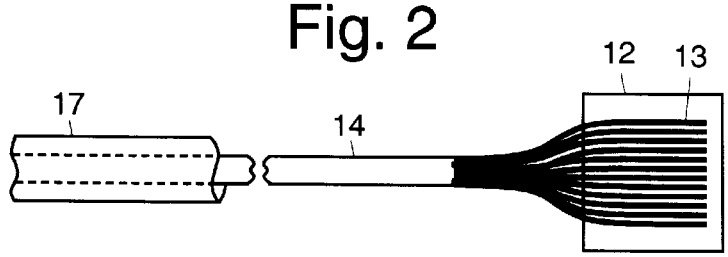
FIG. 2 is an enlarged view illustrating details of a node of the thermal harness of FIG. 1.
Figure 3:
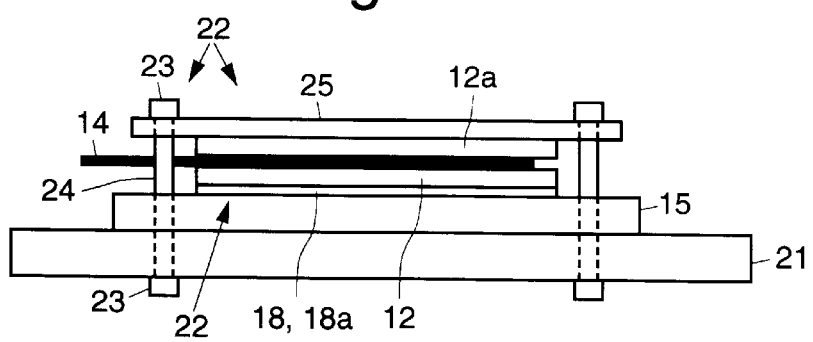
FIG. 3 illustrates interconnection of the thermal harness to a typical heat generating or heat dissipating device.

Referring to the drawing figures, FIG. 1 illustrates an exemplary thermal harness 10 in accordance with the principles of the present invention. FIG. 2 is an enlarged view illustrating details of a node of the thermal harness 10 shown in FIG. 1. FIG. 3 illustrates interconnection of the thermal harness to a typical heat generating or heat dissipating device.

The thermal harness 10 comprises one or more tows 14 of braided or bundled thermally conductive fiber 13, such as carbon, for example, extending from each of one or more heat generating devices 15 one or more heat dissipating device 16. A tow 14 includes multiple filaments of thermally conductive fiber 13. Although thermally conductive fiber such as carbon, is preferably used, other types of thermally conductive fiber materials may be employed. The harness 10 may include an encapsulating membrane 17 (FIG. 2) to contain the multiple tows 14 of braided or bundled thermally conductive fiber 13. In spacecraft applications, the heat generating devices 15 are typically disposed on printed circuit boards 21 (FIG. 3), for example, while the heat dissipating device is typically a radiator panel 16 of a spacecraft 30.

At each node 11 or endpoint 11 of the tows 14 of thermally conductive fiber 13, the tows 14 are fanned out and splayed onto a patch of nonoutgassing polymer matrix material 12, such as Gelvet™ material, for example, available from Johnson Matthey, Inc. Other polymer matrix material 12 include nonoutgassing silicone, or nonoutgassing urethane, for example. A second piece of polymer matrix material 12a (FIG. 3), such as Gelvet material, for example, may be used to encompass or encapsulate the splayed tows 14 of thermally conductive fiber 13 at each node 11.

The polymer matrix material 12 comprises high conductivity, small diameter fibers that are disposed substantially normal to surfaces to which they are attached. The high conductivity fibers adjust to and penetrate surfaces to which they are attached and conform to macroscopic nonplanarity of the surfaces. The fibers of the polymer matrix material 12 thermally contact the heat generating devices 15, the heat dissipating devices 16, and the tows 14 of thermally conductive fiber 13, thus providing a thermal path between them. The high conductivity fibers of the polymer matrix material 12 act as continuous conductors of heat from surfaces of the heat generating devices 15 to the tows 14 of thermally conductive fiber 13. A gel encapsulant may be used to keep the fibers of the polymer matrix material 12 in place and reduce possible contamination.

The node 11 may be attached to the heat generating and heat dissipating devices 15, 16 using securing means 22, such as a layer of adhesive 18 (FIG. 3) disposed between the polymer matrix (Gelvet) material and the respective heat generating and heat dissipating devices 15, 16. Preferably, or in addition, the securing means 22 may comprise a plastic connector 25, or backing plate 25 (FIG. 3), that is secured to the heat generating and heat dissipating devices 15, 16 using nuts 23 and bolts 24, for example. Other conventional securing means 18 may alternatively be employed. Furthermore, the securing means 22 may comprise pyrolytic graphite flakes 18a (FIG. 3) which is used to thermally connect the carbon fibers 13 of the harness 10 with fibers of the polymer matrix (Gelvet) material 12, 12a.

The thermal harness 10 transfers heat from heat generating or dissipating components to heat dispersion components 15, 16 such as radiator panels 16 of the spacecraft 30. Carbon based fiber 13 is preferably used in the harness 10 to interconnect the heat generating and heat dissipating devices 15, 16. The polymer matrix material 12, 12a is preferably an nonoutgassing, space-qualified grade form of polymer matrix material developed by the assignee of the present invention that is disclosed in U.S. patent application Ser. No. 09/435,664, filed Nov. 8, 1999, entitled "Thermal Interface Material Using Thermally Conductive Fiber and Polymer Matrix Materials", and which is assigned to the assignee of the present invention, the contents of which are incorporated herein by reference. The thermal harness 10 can directly transfer the heat to radiator panels 16 and/or a "cold" side of the spacecraft 30. The thermal harness 10 may be used to replace heat spreaders, thermal planes, and other mass intensive thermal management vehicles typically employed in spacecraft.

The thermal harness 10 may provide for multiple branches to a series of heat emanating devices without requiring metallic end fittings at the nodes 11. The thermal harness 10 significantly reduces weight of printed circuit boards 21 or trays, thermal doublers, and heat pipe assemblies. The use of the polymer matrix material 12, 12a to provide connection is also significantly lighter than other approaches that use copper or aluminum to encapsulate the fiber ends.

A primary advantage achieved by the thermal harness 10 is that it is flexible. In addition, the thermal harness 10 provides for reduced weight by eliminating components normally required to reduce junction temperatures. The thermal harness 10 attaches directly to the heat generating and heat dissipating devices 15 and creates a bridge to the heat dissipating devices 16. The thermal harness 10 is extremely lightweight since the carbon fiber 13 has a density of approximately 1.7–2.3 g/cm$^3$. The thermal harness 10 provides efficient heat transfer and may eliminate thermal planes in spacecraft structures.

Thus, an improved thermal harness that may be used in spacecraft applications that overcome the limitation of available heat conducting devices, and especially those used in spacecraft applications has been disclosed. It is to be understood that the above-described embodiments are merely illustrative of some of the many specific embodiments that represent applications of the principles of the present invention. Clearly, numerous and other arrangements can be readily devised by those skilled in the art without departing from the scope of the invention.

What is claimed is:

1. A thermal harness comprising:

one or more tows of thermally conductive fiber extending from a heat generating device to a heat dissipating device, which one or more tows are fanned out and splayed at each end;

a patch of nonoutgassing polymer matrix material containing a plurality of thermally conductive fibers that protrude from a surface of the material, and to which the respective splayed tows are thermally coupled; and securing means for securing the splayed tows to the thermally conductive fibers protruding from the patch of polymer matrix material.

2. The thermal harness recited in claim 1 wherein the plurality of thermally conductive fibers of the polymer matrix comprise carbon fibers.

3. The thermal harness recited in claim 1 wherein the one or more tows are braided.

4. The thermal harness recited in claim 1 wherein the one or more tows are bundled.

5. The thermal harness recited in claim 1 further comprising an encapsulating membrane for containing the one or more tows of thermally conductive fiber.

6. The thermal harness recited in claim 1 further comprising a second patch of nonoutgassing polymer matrix material at each node that encapsulates the splayed tows of thermally conductive fiber.

7. The thermal harness recited in claim 1 wherein the securing means comprises a layer of adhesive.

8. The thermal harness recited in claim 1 wherein the securing means comprises a plastic connector.

9. The thermal harness recited in claim 1 wherein the securing means comprises a backing plate.

10. The thermal harness recited in claim 1 wherein the securing means comprises pyrolytic graphite flakes.

11. A thermal harness for use in a spacecraft, comprising:

one or more tows of thermally conductive fiber extending from a heat dissipating device disposed on the spacecraft to a heat dissipating device disposed on the spacecraft, which tows are fanned out and splayed at each end;

a patch of nonoutgassing polymer matrix material disposed at the heat dissipating device and the heat dissipating device, which patch of nonoutgassing polymer matrix material contains a plurality of thermally conductive fibers that protrude from a surface of the materials, and to which the respective splayed tows are thermally coupled; and securing means for securing the splayed tows to the thermally conductive fibers protruding from the patch of polymer matrix material.

12. The thermal harness recited in claim 11 wherein the plurality of thermally conductive fibers of the polymer matrix material comprise carbon fibers.

13. The thermal harness recited in claim 11 wherein the one or more tows are braided.

14. The thermal harness recited in claim 11 wherein the one or more tows are bundled.

15. The thermal harness recited in claim 11 further comprising an encapsulating membrane for containing the tows of thermally conductive fiber.

16. The thermal harness recited in claim 11 further comprising a second patch of polymer matrix material at each node which encapsulates the splayed tows of thermally conductive fiber.

17. The thermal harness recited in claim 11 wherein the securing means comprises a layer of adhesive.

18. The thermal harness recited in claim 11 wherein the securing means comprises a plastic connector.

19. The thermal harness recited in claim 11 wherein the securing means comprises a backing plate.

20. The thermal harness recited in claim 11 wherein the securing means comprises pyrolytic graphite flakes.

* * * * *